(12) United States Patent
DiStefano et al.

(10) Patent No.: US 6,373,141 B1
(45) Date of Patent: Apr. 16, 2002

(54) BONDABLE COMPLIANT PADS FOR PACKAGING OF A SEMICONDUCTOR CHIP AND METHOD THEREFOR

(75) Inventors: Thomas H. DiStefano, Monte Sereno; Zlata Kovac, Los Gatos; John W. Smith, Palo Alto, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/375,572

(22) Filed: Aug. 16, 1999

Related U.S. Application Data

(62) Division of application No. 08/872,379, filed on Jun. 10, 1997, now Pat. No. 6,030,856.
(60) Provisional application No. 60/019,475, filed on Jun. 10, 1996, and provisional application No. 60/032,960, filed on Dec. 13, 1996.

(51) Int. Cl.[7] ................................. H01L 23/48
(52) U.S. Cl. .................. 257/783; 257/666; 257/784; 257/785
(58) Field of Search ................ 257/666, 783, 257/726, 688, 182, 784, 785; 438/117, 118, 119, 125

(56) References Cited

U.S. PATENT DOCUMENTS

| 3,614,832 A | 10/1971 | Chance et al. | |
| 3,680,037 A | 7/1972 | Nellis et al. | 339/61 M |
| 3,795,037 A | 3/1974 | Luttmer | 29/628 |
| 4,237,607 A | 12/1980 | Ohao | 29/840 |
| 4,545,610 A | 10/1985 | Lakritz et al. | 29/589 |
| 4,604,644 A | 8/1986 | Beckham et al. | 257/778 |
| 4,642,889 A | 2/1987 | Grabbe | 29/840 |
| 4,710,798 A | 12/1987 | Marcantonio | 257/778 |
| 4,793,814 A | 12/1988 | Zifcak et al. | 439/66 |
| 5,148,266 A | 9/1992 | Khandros et al. | 257/783 |
| 5,316,788 A | 5/1994 | Dibble et al. | 426/98 |
| 5,323,294 A * | 6/1994 | Layton et al. | 361/699 |
| 5,932,332 A * | 8/1999 | Pandorf et al. | 428/220 |

FOREIGN PATENT DOCUMENTS

| JP | 2-133680 | * 5/1990 |
| JP | 10-128674 | * 5/1998 |
| RU | 1003-396 A | 8/1980 |

* cited by examiner

Primary Examiner—Jhihan B Clark
(74) Attorney, Agent, or Firm—Lerner, David, Littenberg, Krumholz & Mentlik, LLP

(57) ABSTRACT

A microelectronic package comprising a microelectronic element, resilient element including one or more intermediary layers capable of being wetted and assembled with the microelectronic element, and an adhesive is provided. The adhesive contacts at least one of the one or more intermediary layers and the microelectronic element. A resilient element is also provided.

15 Claims, 9 Drawing Sheets

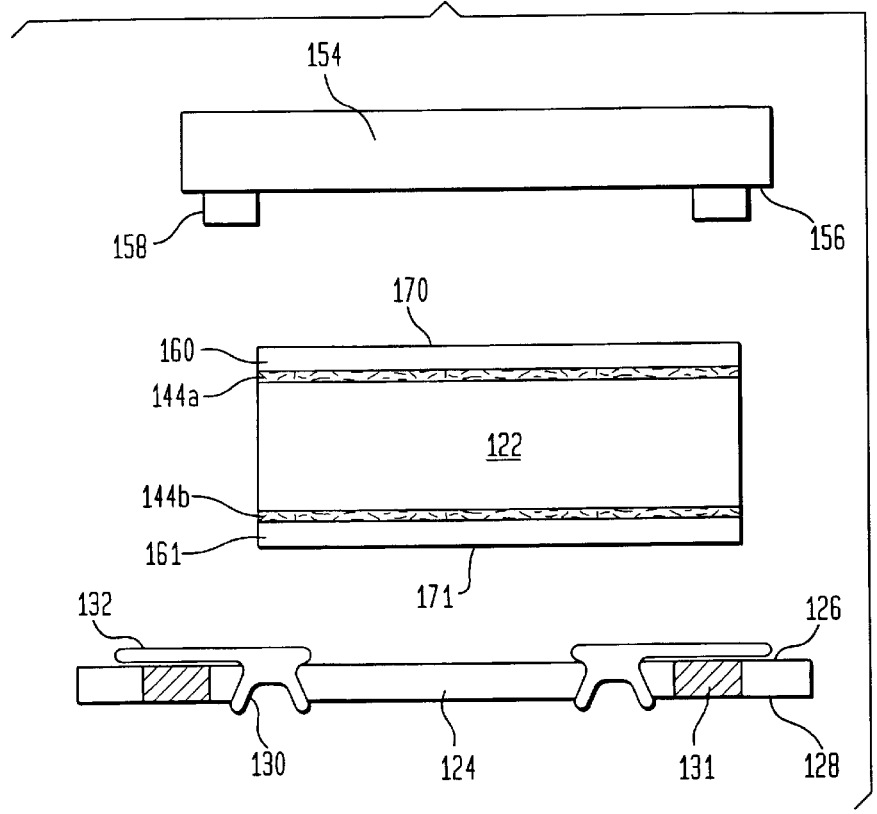
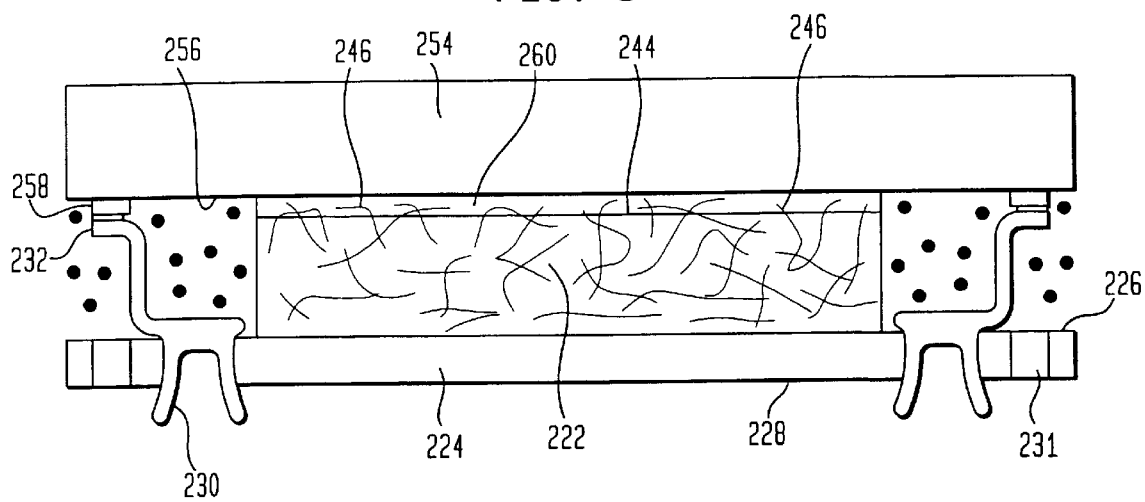

//BONDABLE COMPLIANT PADS FOR PACKAGING OF A SEMICONDUCTOR CHIP AND METHOD THEREFOR

CROSS REFERENCE TO RELATED APPLICATIONS

The present application is a divisional of U.S. patent application Ser. No. 08/872,379, filed Jun. 10, 1997, the disclosure of which is hereby incorporated by reference herein. This application claims benefit of U.S. Provisional Patent application Ser. No. 60/019,475 filed Jun. 10, 1996, the disclosure of which is incorporated herein by reference. The present application is related to U.S. Provisional Patent application Ser. No. 60/032,960 filed Dec. 13, 1996, the disclosure of which is incorporated herein by reference.

FIELD OF THE INVENTION

The present invention relates, generally, to the field of microelectronic packaging, and more particularly relates to provision of a compliant interface between microelectronic elements such as a semiconductor chip and substrate.

BACKGROUND OF THE INVENTION

Designers and manufacturers of electronic devices are continually searching for ways to reduce the size of electronic components. Some recent developments involve the use of solder connections for electrically interconnecting semiconductor chips to printed circuit boards ("PCB") in order to use the space on the PCB more efficiently. Solder connections have proven to be somewhat effective; however, the differences in thermal expansion and contraction ("thermal mismatch") between the semiconductor chip and the PCB places a great amount of stress on the solder connections and may adversely effect the integrity of the numerous solder bonds required to make an electrical connection. Additionally, warpage of either the semiconductor chip or the PCB may also have a negative effect on the integrity of the solder connections.

There have been a number of prior art solutions attempting to reduce the effects of stress on solder connections. One solution teaches embedding wires within each solder column to reinforce the solder (U.S. Pat. No. 4,642,889). Another solution includes wrapping wire around the outside of the solder, and a further solution includes providing a combination of solder and high-lead solder (U.S. Pat. No. 5,316,788). Still other prior art solutions make use of an underfill material disposed between the semiconductor chip and the supporting substrate which allows the stress caused by the thermal mismatch to be more uniformly spread out over the entire surface of the solder connection. All of these prior art solutions are aimed at improving the reliability of solder connections; however, each of these solutions encounters significant problems, such as insufficient compliancy between the semiconductor chip and the PCB.

Several inventions, commonly assigned to the assignee of the present invention, deal effectively with the thermal mismatch problems described above. For example, U.S. Pat. No. 5,148,266 ("the '266 patent") discloses improvements in semiconductor chip assemblies and methods of making the same. In certain embodiments of the '266 patent, a semiconductor chip can be connected to a substrate using a sheet-like, and preferably flexible, interposer. In this embodiment, the interposer overlies the top, contact-bearing surface of the chip. A first surface of the interposer faces towards the chip whereas a second surface faces away from the chip. Electrical terminals, which can be bonded to a substrate, are provided on the second surface of the interposer, and the interposer is provided with apertures extending through it. Flexible leads extend through the apertures, between the terminals on the second surface of the interposer and the contacts on the chip. Because the terminals are movable relative to the contacts on the chip, the arrangements described in the '266 patent provide excellent resistance to differential expansion of the chip relative to the substrate caused by thermal mismatch or thermal cycling. The interposer disclosed in the '266 patent may also include a compliant layer disposed between the terminals and the chip.

Commonly assigned U.S. Pat. No. 5,477,611 ("the '611 patent"), the disclosure of which is incorporated herein by reference, discloses a method for creating an interface between a chip and chip carrier including spacing the chip a given distance above the chip carrier, and introducing a liquid in the gap between the chip and carrier. Preferably, the liquid is a curable material which is cured into a resilient layer such as an elastomer after its introduction into the gap. In a preferred embodiment, the terminals on a chip carrier are planarized or otherwise vertically positioned by deforming the terminals into set vertical locations with a plate, and a liquid is then cured between the chip carrier and chip.

Co-pending, commonly assigned U.S. patent application Ser. No. 08/365,699 entitled "Compliant Interface for a Semiconductor Chip and Method Therefor" filed Dec. 29, 1994 ("the '699 application"), the disclosure of which is incorporated herein by reference, discloses a method of fabricating a compliant interface for a semiconductor chip, typically comprised of a compliant encapsulation layer having a controlled thickness. In certain preferred methods according to the '699 application, a first support structure, such as a flexible, substantially inextensible dielectric film ("dielectric element"), is provided. A resilient element, such as a plurality of compliant pads, is attached to a first surface of the first support structure. Attaching the compliant pads to the first support structure may be accomplished in a number of different ways. In one embodiment, a stencil mask having a plurality of holes extending therethrough is placed on top of the first surface of the support structure. The holes in the mask are then filled with a curable liquid, such as a silicone. After the mask has been removed, the curable liquid is at least partially cured to form an elastomer, such as by heating or by exposure to ultraviolet light. Thus, there is provided an assembly which includes a plurality of compliant pads having channels between adjacent pads.

In a further embodiment of the '699 application, the assembly including the plurality of compliant pads is used with a second support structure such as a semiconductor chip having a plurality of contacts on a first surface. The first surface of the chip is abutted against the plurality of compliant pads and the contacts are electrically connected to a corresponding plurality of terminals on a second side of the support structure. Typically, the first surface of the chip is pressed against the array of compliant pads by a platen engaged with the terminals, thereby assuring the planarity of the first support structure, or flexible dielectric film. A compliant filler such as a curable liquid is then injected into the channels between the chip and the support structure and around the compliant pads while the chip and support structure are held in place. The filler may then be cured to form a substantially uniform, planar, compliant layer between the chip and the support structure. Preferred embodiments of the '699 application provide a compliant, planar interface which effectively accommodates for the thermal mismatch between the chip and a supporting substrate, thereby alleviating much of the stress on the connections therebetween. Further, the combination provides an effective encapsulation barrier against moisture and contaminants.

In the methods of fabricating a compliant interface for a semiconductor chip discussed above, the resilient element or compliant pads may be bonded to either the semiconductor chip or the dielectric element using an adhesive.

Commonly assigned U.S. Pat. No. 5,548,091 describes other methods of bonding compliant elements to the chip and support structure using adhesives. In certain preferred methods according to the '091 patent, a support structure such as a dielectric film is provided with a prefabricated compliant layer. The compliant layer in turn has an adhesive on its surface remote from the dielectric film. The semiconductor chip is placed in contact with the adhesive, and the adhesive is activated to bond the chip to the compliant layer. The adhesive may be provided in a non-uniform layer to facilitate release of air during the bonding process and thus prevent void formation. Known adhesives tend to delaminate from the resilient element under the extreme stresses of temperature and humidity and also under stress of extreme thermal mismatch. Accordingly, still further improvements directed toward providing a resilient element that can be more effectively bonded to microelectronic elements using known adhesives would be desirable.

SUMMARY OF THE INVENTION

The present invention is directed to the desired improvements discussed above.

One aspect of the present invention provides a method of making microelectronic packages. A method in accordance with this aspect of the invention includes the step of providing a first microelectronic element having electrically conductive parts, providing a resilient element having one or more intermediary layers at surface regions of the resilient element which are capable of being wetted by adhesives and assembling the resilient element in proximity with the first microelectronic element. The resilient element may comprise fibrous material, a fibrous mesh or voids at the one or more intermediary layers, thereby providing the resilient element with one or more surface regions capable of being wetted. The resilient element may be a unitary compliant pad having a generally square or rectangular shape or may be in the form of a plurality of compliant pads (e.g., a matrix of pads) with adjacent pads defining channels therebetween, as described in the '699 Application or in co-pending, commonly assigned U.S. patent application entitled "Transferable Compliant Pads for Packaging of a Semiconductor Chip and Method Therefor."

The method also includes the steps of providing a second microelectronic element and assembling the resilient element in proximity with the second microelectronic element. An adhesive is provided in contact with at least one of the intermediary layers of the resilient element and at least one of the microelectronic elements and the adhesive is cured while it remains in contact with at least one of the intermediary layers of the resilient element and at least one of the microelectronic elements. After curing, the adhesive bonds to the intermediary layer at the surface regions of the resilient element. After electrically connecting the microelectronic elements, a liquid encapsulant may be applied to, inter alia, protect the electrical connection and create a compliant layer.

This aspect of the invention incorporates the realization that known adhesives tend to delaminate from the resilient element under the stress of temperature, humidity and thermal cycling. Although the present invention is not limited by any theory of operation, it is believed that these difficulties result from the non-wetting properties of silicone elastomer, and/or the lack of surface irregularities on the resilient element for engaging and intermeshing with the adhesive. In some embodiments adhesives have difficulty wetting to some fully cured resilient elements and thus the adhesives are unable to effectively bond therewith. As a result, there is only weak adhesion between the resilient element and the adhesive resulting in a relatively weak bond between the resilient element and the microelectronic elements. This could result in the failure of the semiconductor chip package during operation. Thus, by providing a resilient element having one or more intermediary layers capable of being wetted with an adhesive, the difficulties associated with creating an effective bond between the surface of the resilient element and the adhesive are substantially eliminated. In preferred embodiments of the present invention, the concept of wetting with an adhesive includes classical chemical wetting whereby the resilient element and the adhesive form a chemical bond and other forms of wetting whereby the adhesive interpenetrates with a fibrous material or the intermediary layer.

In accordance with one embodiment, the resilient element is formed on a dielectric film and has a first intermediary layer. The resilient element is then assembled to a semiconductor chip using a thermosetting adhesive layer disposed between a first intermediary layer of the of the resilient element and the face of the semiconductor chip and is cured while it remains in contact with the first intermediary layer so that the adhesive effectively bonds to the first intermediary layer which in turn bonds the resilient element to the semiconductor chip.

Prior to the curing step, the adhesive typically is provided in a first solid, non-tacky state; however, during the curing step the adhesive is momentarily converted into a fluid state whereby the adhesive is capable of engaging and intermeshing with the fibrous material, fibrous mesh, and/or voids present at the first intermediary layer of the resilient element. Upon further curing of the adhesive, the adhesive transforms from the fluid state to a second solid state, whereby the first intermediary layer is bonded to the front face of the semiconductor chip. After the adhesive has been fully cured, the electrically conductive parts of the dielectric film and the semiconductor chip may be bonded to one another to form electrical interconnections. It is also contemplated that the electrically conductive parts may be bonded together before the adhesive is cured.

Another aspect of the present invention provides methods of making resilient elements having one or more intermediary layers capable of being wetted by an adhesive. The resilient elements which are provided by these methods typically comprise a cured silicone elastomer such as the silicone elastomer SYLGARD™ 577 provided by Dow Coming and can be used in the processes described above, and in other processes for fabricating microelectronic packages. In one preferred embodiment according to this aspect of the invention, a layer of fibrous material such as paper is provided at one or more surface regions of a curable elastomer. In another embodiment, a fibrous mesh or pad is provided at one or more surface regions of a curable elastomer. In a further embodiment, a fibrous material is mixed with or blended into a curable elastomer for providing a curable elastomer having one or more intermediary layers. The fibrous material may include loose fibers such as cellulose fibers, cotton fibers, or synthetic fibers such as nylon or polypropylene. In this embodiment, the fibrous material is mixed with the mass of a curable elastomer so that some of the fibers protrude from the mass after the mixing step. The mass is then subjected to a curing process, such as exposing the mass to heat or ultraviolet light, whereby the mass is transformed into the resilient element having one or more irregular surface regions.

The resilient element provided by the above described methods can be used with an adhesive to bond the resilient element to a microelectronic element. After curing of the adhesive, the adhesive engages and intermeshes with the fibrous material, irregularities and/or voids present at the surface of the resilient element to create a strong bond between the resilient element and the adhesive and avoids the delamination problems described above. In an alternative embodiment, a mixture comprising of mass of a curable elastomer and loose fibers dispersed throughout the mass is introduced between a microelectronic element and a platen. The mixture is then cured to provide the resilient element having one or more irregular surface regions.

A further embodiment of the present invention provides methods of making a resilient element having one or more intermediary layers capable of being wetted whereby the intermediary layers comprise voids provided at one or more surface regions of the resilient element. According to this embodiments a mass of a curable elastomer is provided in a liquid or a semi-liquid form and an agent, such as a gas, is introduced into the mass to form gas bubbles in the curable elastomer. The gas may be introduced into the curable elastomer by injecting the gas into the curable elastomer or by mixing a blowing agent into the curable elastomer and generating the gas by converting the blowing agent to gaseous form. The introduction of the gas into the mass provides one or more intermediary layers comprising of an open cell foam having irregularities such as gaps or voids at one or more surface regions of the resilient element. The voids at the surface regions are capable of receiving, wetting and intermeshing with the adhesive described above while the adhesive is in a fluid state so that when the adhesive transforms back to a solid state the adhesive is intermeshed with the voids to create a strong bond between the resilient element and the adhesive, which in turn creates a strong bond between the resilient element and a microelectronic element.

The present invention also includes embodiments whereby storage liners are placed over the one or more intermediary layers of the resilient element to improve the shelf-life of the resilient element and prevent the resilient element from becoming contaminated.

The present invention includes further embodiments whereby the adhesive is provided at the one or more intermediary layers of the resilient element rather than being provided on microelectronic elements. In one preferred embodiment, a resilient element having first and second intermediary layers is provided by the methods described above. Adhesive layers are then provided over the first and second intermediary layers and storage liners are provided over the adhesive layers to preserve the resilient element while it is in storage. When the resilient element is to be assembled as part of a microelectronic package, the storage liners are removed and the resilient element/adhesive sub-assembly is assembled between microelectronic elements.

The foregoing and other objects and advantages of the present invention will be better understood from the following detailed description of a preferred embodiment taken together with the attached figures.

BRIEF DESCRIPTION OF THE DRAWINGS

FIG. 7 shows the resilient element shown in FIG. 6 immediately prior to being assembled with a semiconductor chip and a dielectric film;

FIG. 8 shows a side view of a microelectronic package including a resilient element having one or more intermediary layers capable of being wetted according to another embodiment of the present invention;

DETAILED DESCRIPTION OF PREFERRED EMBODIMENTS

Figure 1:
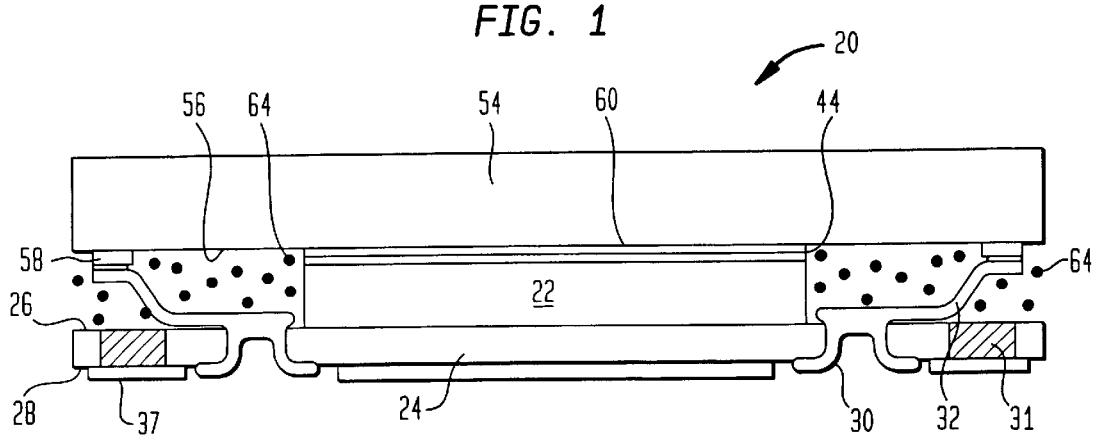
FIG. 1 shows a side view of a microelectronic package including a resilient element having one or more intermediary layers capable of being wetted, according to one embodiment of the present invention.

One embodiment of the present invention, shown in FIGS. 1–4, provides a method of making a microelectronic package 20 including a resilient element 22 having one or more intermediary layers capable of being wetted by an adhesive. Referrng to FIG. 2, an interposer or sheet-like dielectric film 24 having a first surface 26 and a second surface 28 and electrically conductive parts 30 is provided. The sheet-like dielectric film 24 is preferably formed from a polymeric material, such as KAPTON™ (E) available from DuPont Chemical Corporation of an approximate thickness between 25 microns and 75 microns. The dielectric film 24 has conductive terminals 30 on the second surface 28 thereof and electrical parts or leads 32 extending from the terminals 30 for electrically connecting the terminals 30 to another microelectronic element, and bond windows 31 for accessing the leads 32 while electrically connecting the leads 32 with the contacts 26

Figure 2:
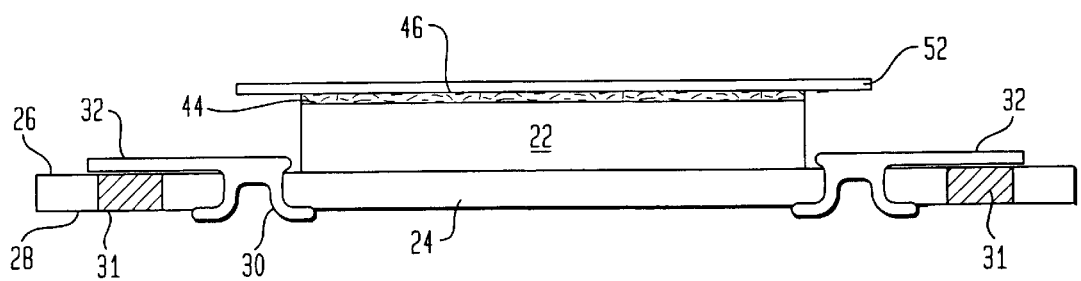
FIG. 2 shows a side view of the resilient element shown in FIG. 1 including a storage liner.
Figure 3:
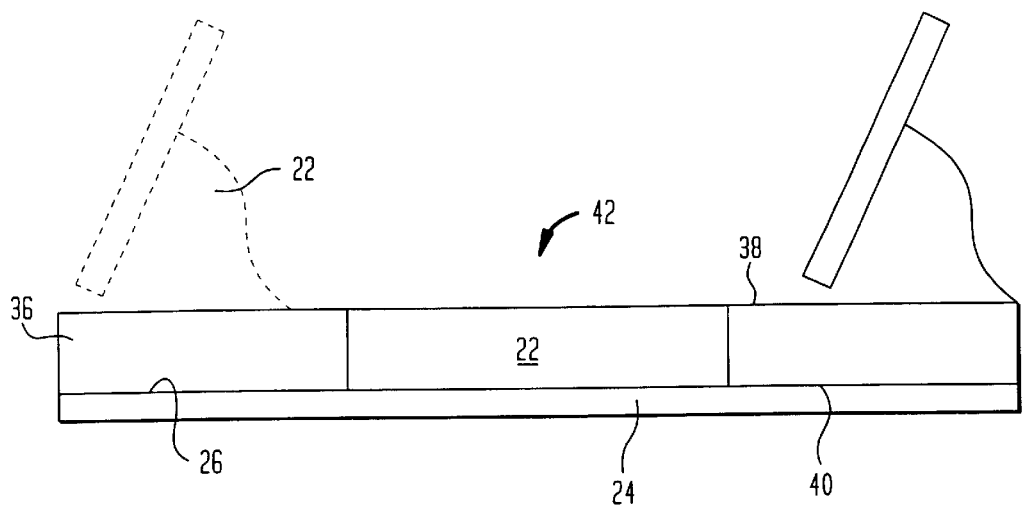
FIG. 3 shows a side view of a stencil mask, including a mass of a curable elastomer used to form the resilient element shown in FIG. 2.

A resilient element 22 having a first intermediary layer 44 capable of being wetted is disposed on the first surface 26 of the dielectric film 24. The resilient element 22 is typically made of a curable liquid elastomer material, such as a silicone elastomer. One material currently being used as a silicone elastomer is SYLGARD 577 manufactured by Dow Corning. The resilient element 22 may be formed in a mold or by using a stencil mask procedure as shown in FIG. 3. In accordance with this procedure, a stencil mask 36 is provided on the first surface 26 of the dielectric film 24. The stencil mask 36 has a top surface 38 and a bottom surface 40 and further has a hole 42 extending therethrough. The bottom surface 40 of the mask 36 is placed atop the first surface 26 of the dielectric film 24 and a mass of a curable elastomer 22 is wiped or screened across the first surface 38 of the mask 36 so that the curable elastomer 22 is deposited into the hole 42. Referring to FIG. 2, the intermediary layer 44 comprises a sheet or layer of fibrous material such as paper, or the synthetic paper known as TYVEK®. As will be discussed below in more detail, the presence of fibers 46 at one or more intermediary layers 44 of the resilient element 22 will make it easier to bond the resilient element 22 to one or more microelectronic elements.

The curable elastomer and intermediary layer 44 are then subjected to a curing process to cure the elastomer whereby some of the fibers 46 intermesh with the elastomer so that the intermediary layer 44 is adhered to the resilient element 22. During the curing process, the liquid elastomer penetrates into the fibrous material. Preferably, the liquid elastomer does not entirely cover the fibrous material. Thus, the fibers on the side of the intermediary 44 layer facing away from the elastomer remain exposed, and are not covered by the cured elastomer. Penetration of the liquid elastomer into the intermediary layer 44 is controlled in part by the wettability of the fibers by the liquid elastomer. The intermediary layer 44 can be subjected to conventional surface modification processes such as application of surface-active agents, corona discharge treatment or plasma treatment prior to assembly with the elastomer to enhance wettability. These treatments may be applied to both sides of the intermediary layer 44 or may be applied only to the side of the layer which will face the elastomer, so as to promote partial wetting of the intermediary layer 44 by the elastomer.

Referring to FIG. 2, the cured resilient element 22 is then prepared for storage by providing a removable storage liner 52 over the intermediary layer 44. The storage liner 52 enables the resilient element 22 to be efficiently handled and moved and also protects the resilient element 22 from contamination while it is in storage. The level of adhesion between the storage liner 52 and the intermediary layer 44 should be significantly lower than the level of adhesion between the resilient element 22 and the dielectric film 24 so that the liner 52 can be easily removed without affecting the bond between the resilient element 22 and the dielectric film 24. The cured resilient element 22 with the first intermediary layer 44 is then placed in storage until it is required for being assembled to another microelectronic element. In other embodiments, the use of a storage liner 52 may not be necessary, particularly in cases where the resilient element 22 is immediately assembled to another microelectronic element after being cured on the dielectric film 24.

Figure 4:
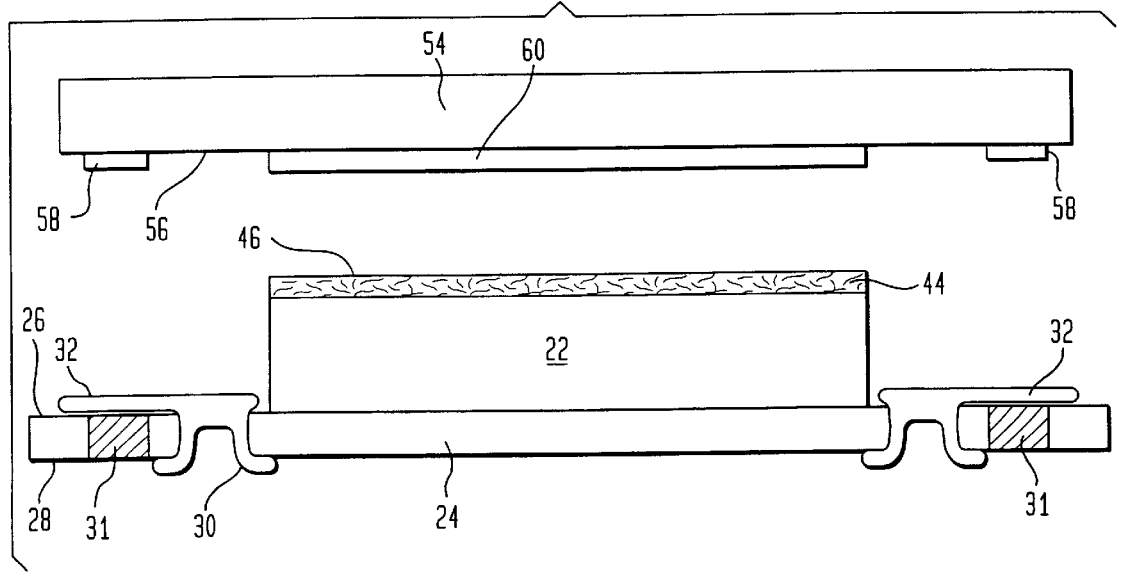
FIG. 4 shows a side view of the resilient element shown in FIG. 2 immediately before the resilient element is assembled with a semiconductor chip.

Referring to FIG. 4, the resilient element 22 having the first intermediary layer 44 is prepared for assembly to a semiconductor chip 54. The chip 54 has a generally planar front face 56 including electrical parts or contacts 58 formed on peripheral regions of the front face 56. The contacts 58 are arranged in rows (not shown) which are adjacent, and run parallel to, each edge of the chip 54. The contacts 58 in each row are spaced at very close intervals, typically about 100 to about 250 micrometers center-to-center. This center-to-center spacing is adequate for high I/O count chips used with wire bonding or tape automated bonding systems. A thermosetting adhesive 60, commonly referred to as a "snap-cure" adhesive, is provided at the front face 56 of the semiconductor chip 54. Generally, such an adhesive 60 is initially provided in a first solid, non-tacky state. During a curing procedure, the adhesive 60 momentarily transforms into a fluid state upon being heated above a pre-set activation temperature. After further heating, the adhesive 60 transforms back into a second solid state. One suitable solvent-free "snap-cure" adhesive is sold under the trade name ABLEBOND 967-3, by the Ablestik Electronic Materials and Adhesives Company of Rancho Dominguez, Calif.

Prior to assembling the resilient element/dielectric film subassembly with the semiconductor chip 54, the storage liner 52 (FIG. 2) is removed from the first intermediary layer 44 of the resilient element 22 to expose the fibers 46. The dielectric film 24 and the resilient element 22 are then disposed in proximity to or assembled with the semiconductor chip 54 so that the fibers 46 at the intermediary layer 44 are in contact with the adhesive layer 60 on the front face 56 of the semiconductor chip 54. While the first intermediary layer 44 of the resilient element 22 is held in contact with the adhesive 60, the adhesive 60 is subjected to a curing process to bond the adhesive 60 to the first intermediary layer 44 which in turn bonds the resilient element 22 to the front face 56 of the semiconductor chip 54.

Figure 5:
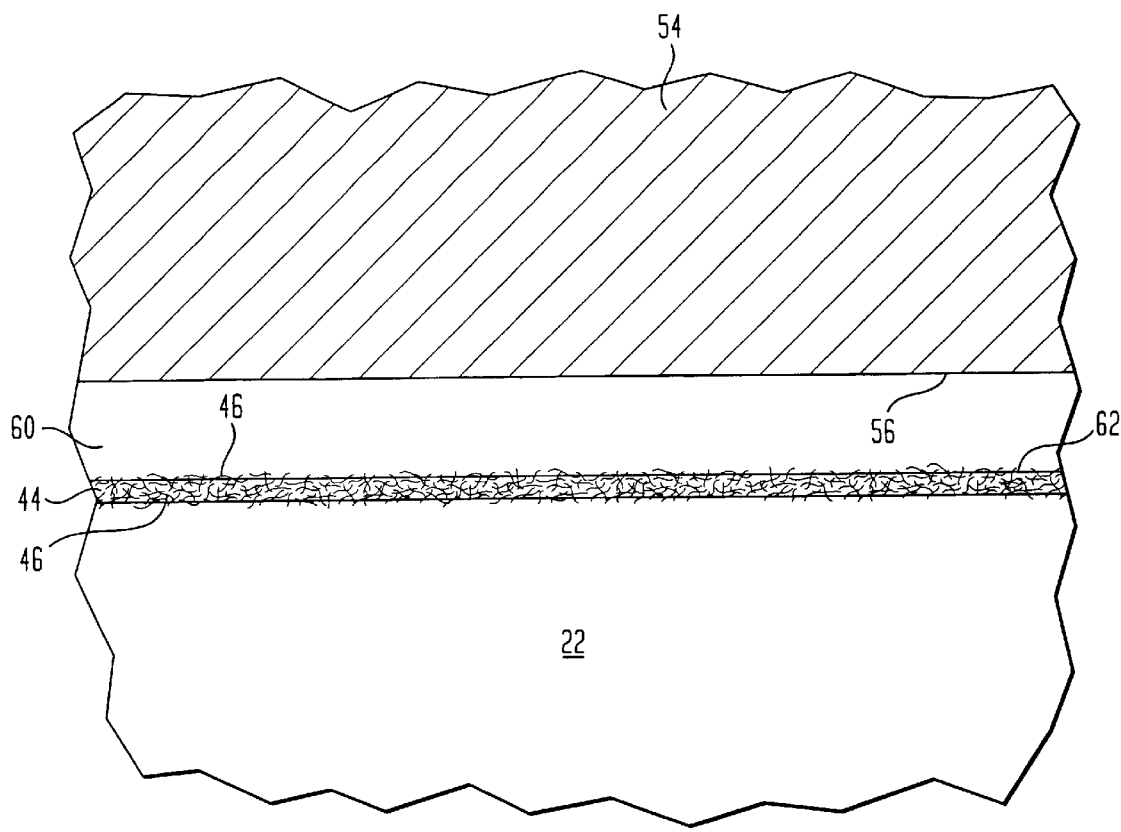
FIG. 5 shows a fragmentary sectional side view of the embodiment shown in FIG. 1.

As previously discussed, prior to the curing step, the adhesive 60 is in a first solid, non-tacky state. The adhesive 60 is then subjected to the curing process to momentarily convert the adhesive 60 from the first solid state to a fluid state. Referring to FIG. 5, while in the fluid state, the adhesive 60 intermeshes with the fibers 46 to form a matrix of adhesive 60 and fibers 46 at the interface 62 of the intermediary layer 44 and the adhesive 60. The adhesive 60 is then subjected to additional curing whereby it transforms from the fluid state to a second solid state. Thus, after the adhesive 60 has been cured to its second solid state, the first intermediary layer 44 of the resilient element 22 is bonded to the front face 56 of the semiconductor chip 54.

Referring to FIG. 1, after the resilient element 22 has been bonded to the chip 54, each terminal 30 on the dielectric film 24 may be connected with an associated contact 58 on the chip 54 by bonding the leads 32 to the contacts 58. The terminals 30 and leads 32 may be formed from substantially any electrically conductive material, but preferably are formed from metallic materials such as copper and copper alloys, noble metals and noble metal alloys and are typically fabricated by conventional photolithographic and etching or deposition techniques. The leads 32 are electrically connected to the contacts 58 on the chip 54 by a conventional wire bonding operation, or by a bonding operation as shown in U.S. Pat. Nos. 5,398,863; 5,390,844; 5,536,909 and 5,491,302.

In the next stage of the process, a low elastic modulus dielectric encapsulant or compliant filler 64, such as a liquid silicone rubber or other curable liquid elastomer, is allowed to flow between the dielectric film 24 and the chip 54 and around the resilient element 22 and the leads 32 while the chip 54 and the dielectric film 24 are compressed together or held in place. A mask/coverlay 37 may be placed over bond windows 31 to prevent the compliant filler 64 from flowing through the bonds windows 31 when the filler 64 is introduced between the chip 54 and dielectric film 24. The compliant filler 64 is then cured by energy such as heat, ultraviolet light or other radiant energy to form a substantially uniform, planar, compliant layer between the chip and a support structure. Because the encapsulant 64 comprising liquid silicone is applied after bonding, there is no risk of the liquid silicone coming in contact with the leads 32 or contacts 58 before bonding, which could diminish the strength of the bond between the leads 32 and the contacts 58.

In another embodiment, the adhesive is not provided at the front face 56 of the semiconductor chip 54, but is provided as part of the resilient element/dielectric film subassembly. In this embodiment, after the resilient element 22 including the intermediary layer has been cured, the adhesive is placed over the intermediary and a storage liner is placed over the adhesive. Among other functions, the storage liner protects the adhesive and the resilient element/dielectric film subassembly from contamination. Prior to bonding the resilient element to the semiconductor chip, the storage liner is removed to expose the first surface of the adhesive. The dielectric film/resilient element/adhesive subassembly is then disposed in proximity to or assembled with the semiconductor chip so that the first surface of the adhesive is in contact with the front face of the semiconductor chip. The adhesive is then subjected to a curing process to bond the first intermediary layer of the resilient element to the adhesive which in turn bonds the resilient element to the front face of the semiconductor chip.

Figure 6:
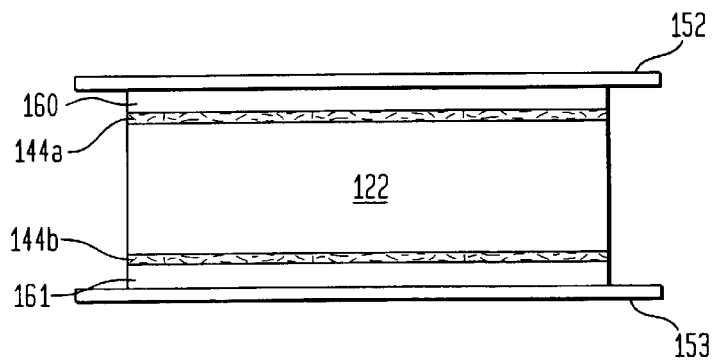
FIG. 6 shows a side view of another embodiment of a resilient element having one or more intermediary layers capable of being wetted.

Referring to FIG. 6, in another embodiment, the resilient element 122 has a first intermediary layer 144*a* and a second intermediary layer 144*b* and first and second adhesive layers 160, 161 provided over the first and second intermediary layers 144*a*, 144*b*, respectively. The resilient element/intermediary layer/adhesive subassembly is then disposed between first and second storage liners 152, 153 for storing the resilient element 122 until it is required for being assembled to microelectronic elements. The subassembly depicted in FIG. 6 is readily fabricated in a continuous or semicontinuous process. One continuous process includes depositing a layer of the curable material on one intermediary layer comprising fibrous material, in a continuous coating process; uniting the layer of curable elastomer with another intermediary layer of fibrous material; and then curing the elastomer. Before or during the curing step, the elastomer and intermediary layers can be squeezed in a nip between a pair of rollers or belts, so as to bring the assemblage to a controlled, even thickness. The adhesive and release layers can be applied in further continuous or semicontinuous coating operations. The resulting continuous web can be subdivided by punching or cutting pieces of the desired size. The subdividing step can be performed immediately prior to use.

Referring to FIG. 7, during final assembly, the resilient element/intermediary layer/adhesive subassembly is positioned adjacent a semiconductor chip 154 and a dielectric film 124. The first and second storage liners 152, 153 are removed to expose the external surface regions 170, 171 of the first and second adhesive layers 160, 161, and the resilient element 122 is assembled in proximity with the semiconductor chip 154 and the dielectric film 124 so that the first adhesive layer 160 is in contact with the front face 156 of the semiconductor chip 154 and the second adhesive layer 161 is in contact with the first surface 126 of the dielectric film 124. The thermosetting adhesive 160, 161 is then subjected to a curing process whereby the adhesive 160, 161 transforms from a first solid state to a fluid state and back to a second solid state for bonding the resilient element 122 to the front face 156 of the semiconductor chip 154 and the first surface 126 of the dielectric film 124, respectively.

Figure 9:
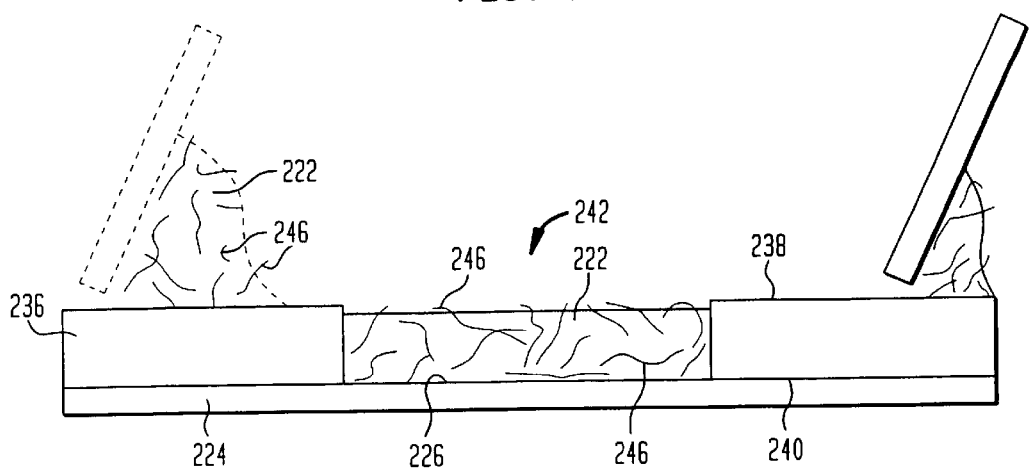
FIG. 9 shows a side view of a stencil mask, including a mixture of a curable elastomer and loose fibers used to form the resilient element shown in Fig. 8.

FIGS. 8 and 9 show another embodiment of a resilient element 222 having a first intermediary layer 244 capable of being wetted. In this embodiment, the first intermediary layer 244 includes fibrous material 246 which is present at or protrudes from the resilient element 222 at the first intermediary layer 244. The resilient element 222 of this embodiment is generally formed by providing a mixture comprising a mass of a curable liquid elastomer material 222 and loose individual fibers 246 which are mixed into the curable elastomer 222. The fibers 246 may be natural fibers such as cellulose or cotton, or may be synthetic fibers such as NYLON® or polypropylene. The curable elastorner 222 and loose fiber 246 mixture may be provided on the dielectric film 224 by using the stencil mask procedure described above and shown in FIG. 9. After the mixture of the curable elastomer 222 and loose fibers 246 has been screened onto the dielectric film 224, some of the loose individual fibers 246 are present at or protrude from a surface region of the curable elastomer 222 to form the first intermediary layer 244. The curable elastomer 222 is then subjected to a curing process to provide the cured resilient element 222 having the first intermediary layer 244 as shown in FIG. 10.

Figure 10:
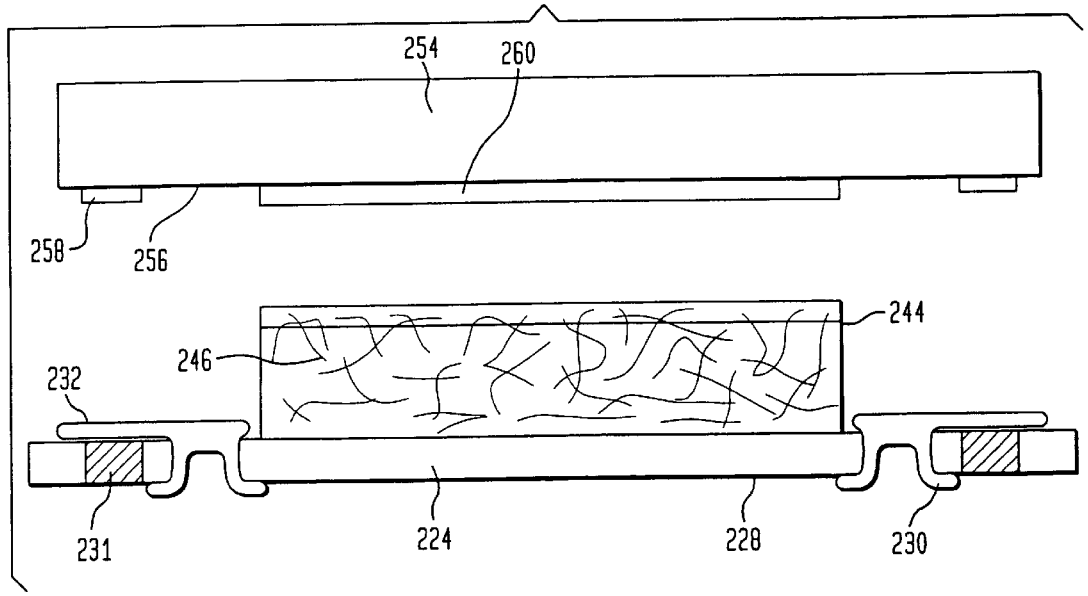
FIG. 10 shows the resilient element shown in FIG. 8 immediately prior to being assembled with the semiconductor chip.

Referring to FIG. 10, a semiconductor chip 254 having a front face 256 is provided for being assembled to the resilient element 222/dielectric film 224 subassembly. A first layer of thermosetting adhesive 260 is provided between the front face 256 of the chip 254 and the first intermediary layer 244 of the resilient element 222. After the resilient element 222 has been assembled with the semiconductor chip 254, the adhesive 260 is subjected to a curing process as described above. As shown in FIG. 8, once the adhesive 260 has been cured to a second solid state, the fibrous material 246 at the first intermediary layer 244 is locked or encapsulated in the adhesive 260, which in turn bonds the resilient element 222 and the chip 254 together.

Figure 11:
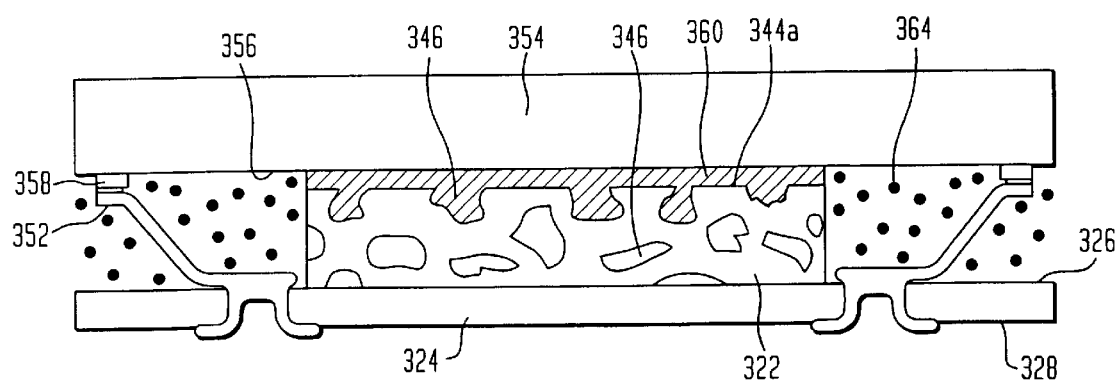
FIG. 11 shows a side view of a microelectronic package including a resilient element having one or more intermediary layers capable of being wetted according to a further embodiment of the present invention.
Figure 12:
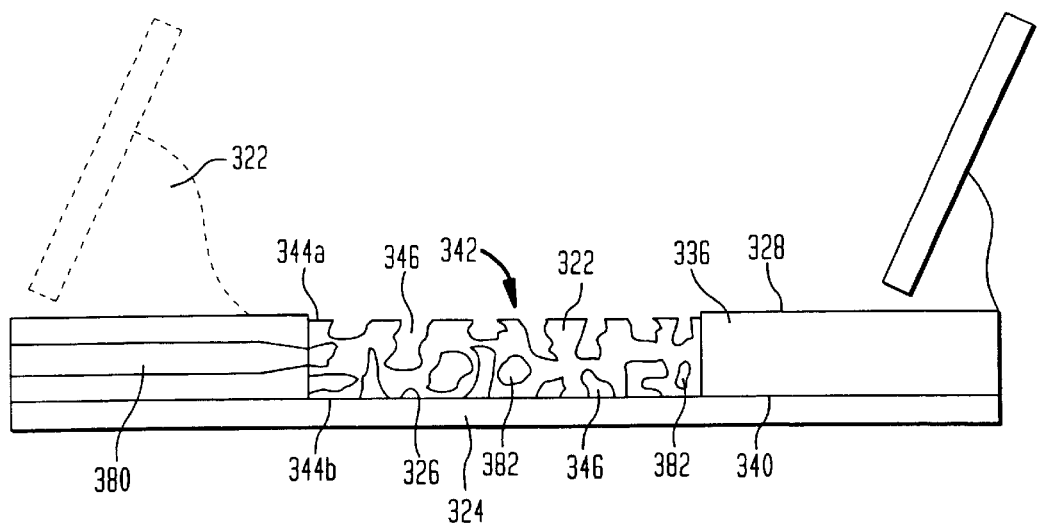
FIG. 12 shows a side view of a stencil mask, including a curable elastomer having voids formed at one or more intermediary layers thereof.

Another embodiment of the present invention, shown in FIG. 11, provides a method of making a microelectronic package including a resilient element 322 having an intermediary layer 344 including voids 346 at one or more surface regions of the resilient element 322. The voids 346 may be in the form of open cells or orifices at the intermediary layer 344. Referring to FIG. 12, the resilient element 322 is generally formed by using a stencil mask procedure whereby a mass of a curable elastomer 322 is provided on a dielectric film 324 by using a stencil mask 336 having top and bottom surfaces 338, 340 and further having a hole 342 extending therethrough. The bottom surface 340 of the mask 336 is placed atop a first surface 326 of the dielectric film 324 and the curable elastomer 322 is wiped or screened across the first surface 338 of the mask 336 so that the curable elastomer 322 is deposited into the hole 342. A gas (not shown), such as air, is then introduced into the curable elastomer 322 before the curable elastomer is subjected to a curing process. The gas may be introduced through a tube 380 extending through the side of the mask 336 and into a side surface region of the curable elastomer 322. In another embodiment, the gas may be introduced by way of a blowing agent. Blowing agents, as commonly utilized in the plastics industry, are volatile compounds or reactive compounds which form gasses under the conditions utilized in forming an article. For example, volatile organic materials such as low molecular weight alkanes and partially or wholly halogenated alkanes may be dispersed in the curable elastomer. When the elastomer is subjected to heat during the curing process, the organic material vaporizes to form a gas, which in turn forms voids throughout the elastomer. Essentially any volatile material which is chemically compatible with the curable elastomer and does not cause undesired side reactions during the curing step can be used in the same manner. Reactive blowing agents include mixtures of carbonates and organic acids, which react to yield carbon dioxide. Other mixtures of reactants can be employed, again provided that the reactants and products do not cause undesired reactions with the elastomer. Blowing agents and their use in formation of polymer foams are described in "Plastics Engineering Handbook," 4th ed., Van Nostrand Reinhold Company, 1976, pp. 499 set seq., which is incorporated by reference herein.

Figure 13:
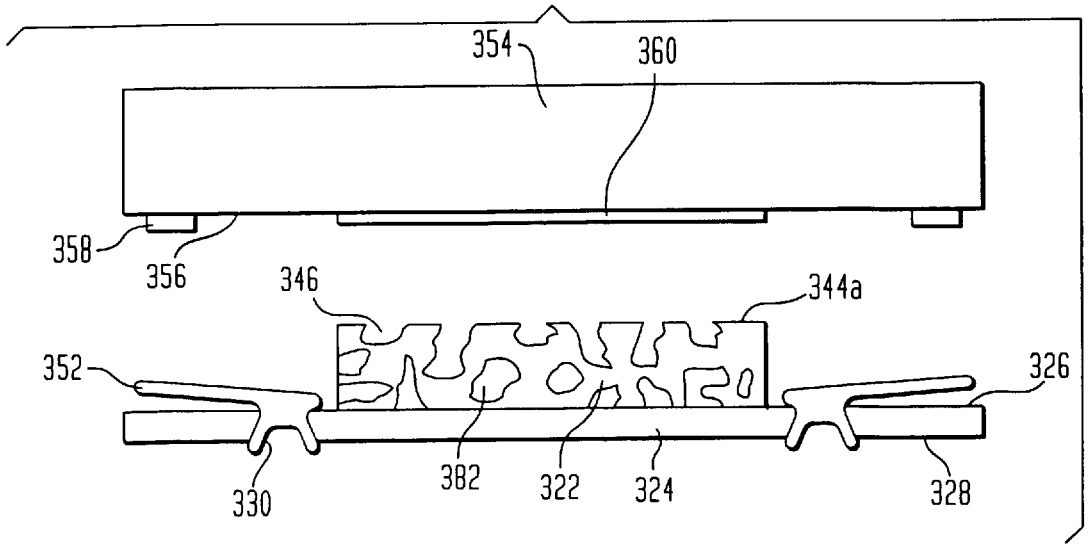
FIG. 13 shows the resilient element shown in FIG. 11 immediately prior to being assembled with a semiconductor chip.

The introduction of the gas into the curable elastomer 322 forms gas bubbles 382 in the curable elastomer 322 and an open cell foam having irregularities such as gaps and voids 346 at first and second intermediary layers 344a, 344b of the curable elastomer 322, As described above, the gaps and voids 346 provide for better bonds between the resilient element 322 and an adhesive. The curable elastomer 322 is then subjected to a curing process to provide the resilient element having first and second intermediary layers 344a, 344b shown in FIGS. 11 and 13. After curing, the resilient element 322 may have a smooth skin thereby requiring the skin to be shaved or disrupted to ensure that voids 346 are present at the intermediary layers 344a, 344b. The resilient element 322 may be stored separately from the dielectric film 324 until it is needed for fabricating a microelectronic package. A storage liner (not shown) may be placed over the intermediary layers 344a, 344b of the resilient element 322 to avoid contamination of the resilient element 322 during storage.

Figure 14:
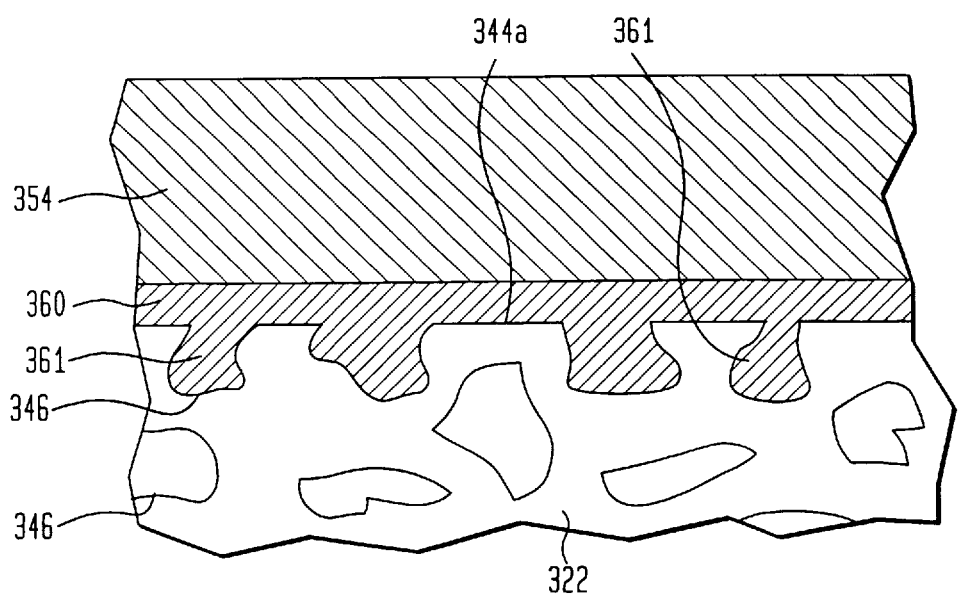
FIG. 14 shows a sectional side view of the resilient element shown in FIG. 11.

The resilient element 322/dielectric film 324 subassembly is then assembled to the semiconductor chip 354 having an adhesive 360 provided at the front face 356 of the semiconductor chip 354. Prior to the curing step, the adhesive 360 is in a first solid, non-tacky, state. The adhesive 360 is then subjected to a curing process to momentarily convert the adhesive 360 from the first solid state to a fluid state. Referring to FIGS. 11 and 14, while in the fluid state, the adhesive 360 flows into the voids or gaps 346 present at the first intermediary layer 344a. The adhesive 360 is then subjected to additional curing whereby the adhesive 360 transforms from the fluid state to a second solid state. The fully cured adhesive 360 includes tentacles or branches 361, which extend into the voids 346 in the first intermediary layer 344a thereby engaging and intermeshing with the resilient element 322 to provide a highly effective bond between the resilient element 322 and the semiconductor chip 354.

Figure 15:
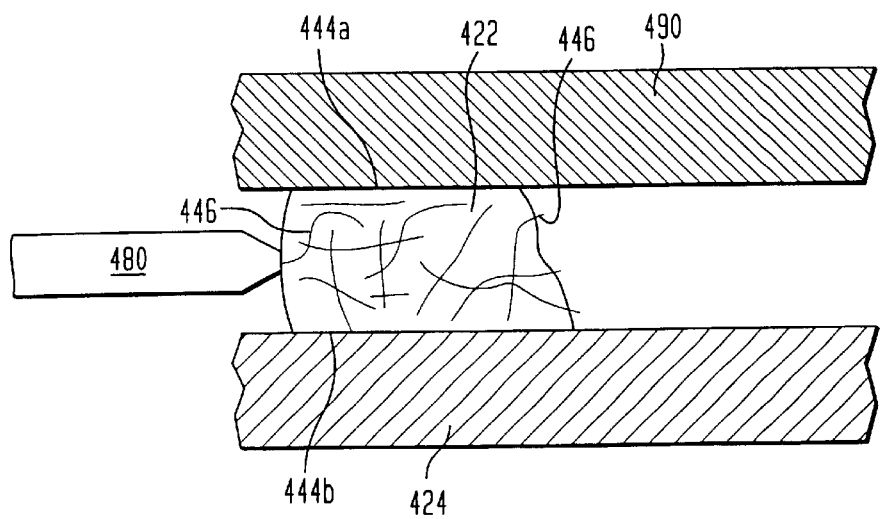
FIG. 15 shows a side view of another embodiment for forming a resilient element having one or more intermediary layers capable of being wetted.

FIG. 15 shows another preferred embodiment of the present invention which may be used to form a resilient element 422 having one or more intermediary layers 444 capable of being wetted. In accordance with this embodiment, a resilient element 422 having one or more intermediary layers 444 is formed between a dielectric film 424 and a platen 490. As described above, a mass of a curable liquid elastomer 422 is prepared and loose individual fibers 446 are mixed or blended into the curable elastomer 422 so that the loose fibers 446 protrude from the surface regions of the curable elastomer 422. The curable elastomer 422 and loose fiber 446 mixture is then introduced between the platen 490 and the dielectric film 424. In accordance with one preferred embodiment, the curable elastomer 422 and loose fiber 446 mixture is injected between the platen 490 and dielectric element 424 using a nozzle 480. A first intermediary layer 444a of the curable elastomer 422 is in contact with the platen 490 and a second intermediary layer 444b of the curable elastomer 422 is in contact with the dielectric film 424. The curable elastomer 422 is then cured to provide a resilient element 422 having first and second intermediary layers 444a, 444b, including fibers 446 protruding therefrom.

Figure 16:
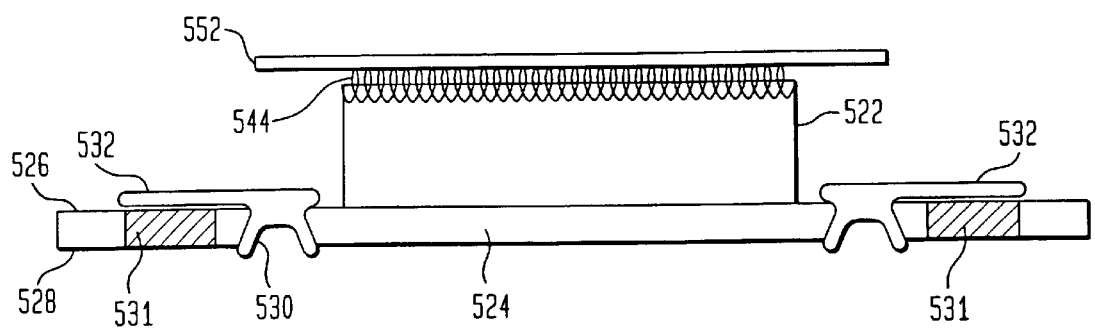
FIG. 16 shows a side view of still another embodiment of a resilient element according to the present invention.

FIG. 16 shows another embodiment of a resilient element 522 having a first intermediary layer 544 capable of being wetted. In this embodiment, the first intermediary layer 544 includes a fibrous mat or pad which is present at and/or protrudes from one or more surface regions of the resilient element 522. A mass of a curable elastomer is screened or stencil printed onto a dielectric film 524, according to methods described above. The intermediary layer 544 is then placed in contact with one or more surface regions of the curable elastomer. The curable elastomer is then cured to provide the resilient element having the first intermediary layer 544. A storage liner 552 is placed over the intermediary layer 544 to prevent contamination of the resilient element 522. The resilient element 522 according to this embodiment can be stored until it is required for fabricating a microelectronic package.

Figure 17:
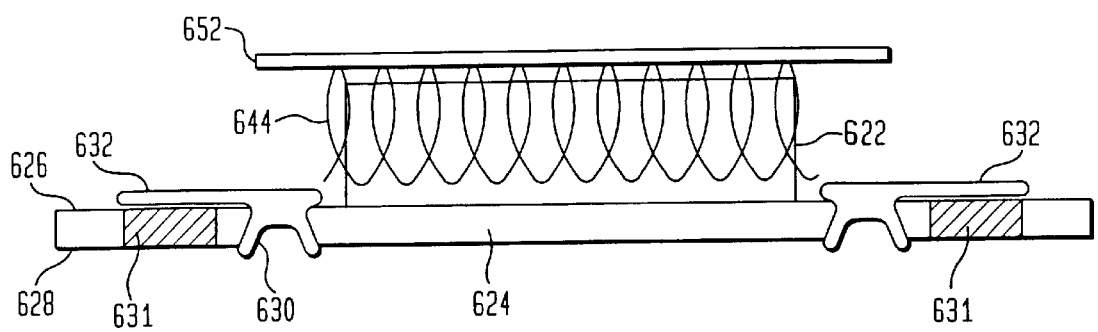
FIG. 17 shows a side view of a further embodiment of a resilient element according to the present invention.

FIG. 17 shows yet another embodiment including a resilient element 622 having an intermediary layer 644, whereby the intermediary layer encompasses the entire resilient element 622. After the resilient element 622 is cured, a storage liner 652 is placed over the intermediary layer 644 of the resilient element 622 to prevent contamination and increase the shelf life of the resilient element 622. The resilient element 622 in accordance with this embodiment may be assembled to a second microelectronic element using the processes described above.

Figure 18:
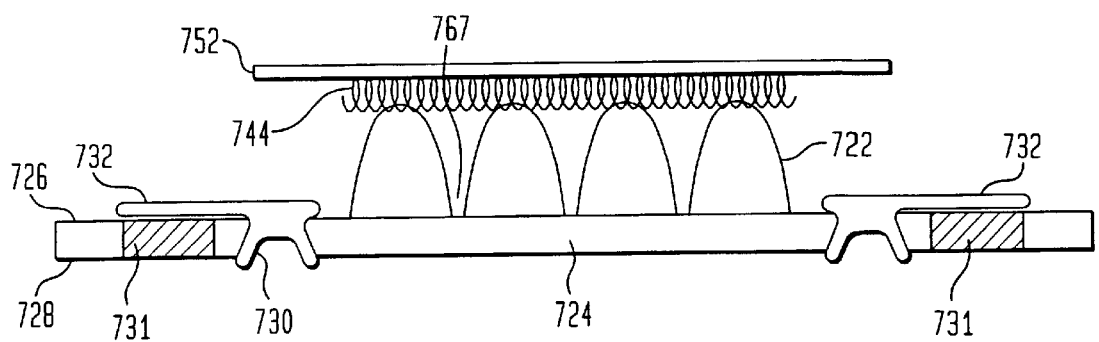
FIG. 18 shows a side view of still a further embodiment of a resilient element according to the present invention.

FIG. 18 shows still another embodiment whereby the resilient element 722 includes a plurality or array of compliant pads. The plurality of compliant pads define channels 767 running between adjacent pads. The plurality of compliant pads are provided on a dielectric film 724 in accordance with processes described in the '699 application, which is incorporated herein by reference. A first intermediary layer 744 comprising a fibrous pad is provided at one or more surface regions of the array of compliant pads. The intermediary layer 744 is capable of being wetted to an adhesive for effectively assembling the resilient element 722 to a second microelectronic electronic element. A storage liner 752 is provided over the intermediary layer 744 to prevent contamination and increase the shelf life of the resilient element 722. It is also contemplated that the intermediary layer comprises fibrous material and/or voids and incorporates all of the features of the present invention discussed above.

As will be readily appreciated, numerous variations and combinations of the features discussed above can be utilized. For example, there are many other materials which may be introduced into a curable elastomer or at surface regions of a curable elastomer to generate a resilient element having intermediary layers capable of being wetted by an adhesive. It is also contemplated that fibrous materials and gases can be used in combination to generate the intermediary layers, and that the resilient element according to the present invention can be used to bond other types of electrical and/or mechanical components than those described herein. Also, the particular configurations of the elastomeric resilient elements, dielectric elements and semiconductor chip are merely illustrative. For example, the present invention can be used where a resilient element is to be bonded between the rear face of a chip and a dielectric element. Also, the present invention can be used where the resilient element includes a compliant material such as a gel or other viscoelastic material. Accordingly, the term "elastomer" as used herein should be understood as embracing gels and other compliant materials as well as materials commonly regarded as elastomers. As these and numerous other variations and combinations of the features discussed above may be employed without departing from the present invention, the foregoing description of the preferred embodiment should be taken by way of illustration, rather than by way of limitation, of the features discussed above.

We claim:

1. A microelectronic package comprising:
    a microelectronic element;
    a resilient element having one or more intermediary layers capable of being wetted, said resilient element being assembled in proximity with said microelectronic element;
    an adhesive in contact with at least one of said one or more intermediary layers of said resilient element and said microelectronic element.

2. A package as claimed in claim 1, further comprising:
    a second microelectronic element, said resilient element being assembled in proximity with said second microelectronic element.

3. A package as claimed in claim 1, wherein said resilient element includes voids at said one or more intermediary layers.

4. A package as claimed in claim 1, wherein said resilient element includes fibrous material at said one or more intermediary layers.

5. A package as claimed in claim 1, wherein said second microelectronic element includes a semiconductor chip having contacts.

6. A package as claimed in claim 1, wherein said resilient element includes an array of compliant pads, adjacent pads of said array of compliant pads defining channels therebetween.

7. A package as claimed in claim 2, wherein said first and second microelectronic elements have electrically conductive parts which are connected for electrically interconnecting said first and second microelectronic elements.

8. A package as claimed in claim 2, wherein said first microelectronic element includes a flexible dieletric film.

9. A package as claimed in claim 3, wherein said adhesive is in contact with one or more of said voids.

10. A package as claimed in claim 4, wherein said fibrous material includes fibers protruding from said one or more intermediary layers.

11. A package as claimed in claim 4, wherein said fibrous material is selected from the group consisting of cellulose fibers, cotton fibers and synthetic fibers.

12. A resilient element for a microelectronic assembly comprising a mass of an elastomer and fibrous material at least partially embedded in the elastomer so that portions of the fibrous material are exposed at at least one surface region of the mass.

13. A resilient element for a microelectronic assembly comprising a mass of an elastomer and fibrous material at least partially embedded in the elastomer so that portions of the fibrous material are exposed at least one surface region of the mass, said fibrous material being provided in at least one intermediary layer covering said at least one surface region, and the elastomer penetrates into each said intermediary layer to thereby engage the fibrous material in the elastomer.

14. An element as claimed in claim 13 wherein said fibrous material is provided in two layers covering two oppositely-facing surface regions of said resilient element.

15. An element as claimed in claim 13 further comprising an adhesive in contact with each said intermediary layer of fibrous material.

* * * * *

UNITED STATES PATENT AND TRADEMARK OFFICE
CERTIFICATE OF CORRECTION

PATENT NO.   : 6,373,141 B1                                           Page 1 of 1
DATED        : April 16, 2002
INVENTOR(S)  : Thomas H. DiStefano, Zlata Kovac and John W. Smith It is certified that error appears in the above-identified patent and that said Letters Patent is hereby corrected as shown below:

Column 5,
Line 26, "embodiments" should read -- embodiment, --.

Column 7,
Line 16, "Coming" should read -- Corning --.

Column 8,
Line 7, "fonned" should read -- formed --.

Column 14,
Line 27, "exposed at least" should read -- exposed at at least --.

Signed and Sealed this

Sixth Day of August, 2002

Attest:

JAMES E. ROGAN
Attesting Officer    Director of the United States Patent and Trademark Office